United States Patent
Naito et al.

(10) Patent No.: US 12,486,953 B2
(45) Date of Patent: Dec. 2, 2025

(54) LIGHTING DEVICE

(71) Applicant: KOITO MANUFACTURING CO., LTD., Tokyo (JP)

(72) Inventors: Ryota Naito, Shizuoka (JP); Shuhei Matsuda, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 18/853,753

(22) PCT Filed: Apr. 17, 2023

(86) PCT No.: PCT/JP2023/015271
§ 371 (c)(1),
(2) Date: Oct. 3, 2024

(87) PCT Pub. No.: WO2023/210417
PCT Pub. Date: Nov. 2, 2023

(65) Prior Publication Data
US 2025/0224085 A1    Jul. 10, 2025

(30) Foreign Application Priority Data
Apr. 26, 2022   (JP) ................... 2022-072787

(51) Int. Cl.
*F21K 9/62* (2016.01)
*F21K 9/61* (2016.01)
(Continued)

(52) U.S. Cl.
CPC .......... *F21K 9/62* (2016.08); *F21K 9/61* (2016.08); *F21K 9/68* (2016.08); *F21Y 2113/13* (2016.08); *F21Y 2115/10* (2016.08)

(58) Field of Classification Search
CPC ..... F21K 9/62; F21K 9/61; F21K 9/68; F21K 9/64; F21Y 2113/17; F21Y 2113/13; F21Y 2113/10; H05B 45/28
See application file for complete search history.

(56) References Cited

U.S. PATENT DOCUMENTS

| | | | |
|---|---|---|---|
| 2009/0086475 A1* | 4/2009 | Caruso | F21K 9/65 362/231 |
| 2011/0210354 A1* | 9/2011 | Ichikawa | H10H 20/857 438/27 |

(Continued)

FOREIGN PATENT DOCUMENTS

| | | |
|---|---|---|
| JP | 2010-218991 A | 9/2010 |
| JP | 2013-30594 A | 2/2013 |

(Continued)

OTHER PUBLICATIONS

International Search Report for International Application No. PCT/JP2023/015271 dated May 23, 2023.

*Primary Examiner* — Erin Kryukova
(74) *Attorney, Agent, or Firm* — Sughrue Mion, PLLC

(57) ABSTRACT

A lighting device capable of improving yield by relaxing a selection requirement for turquoise blue and making chromaticity uniform is provided. The lighting device (100) includes a first light-emitting element (12a) that emits first light belonging to a first chromaticity rank, a second light-emitting element (12b) that emits second light belonging to a second chromaticity rank, and a light mixing unit (20) that mixes the first light and the second light and radiates the light as radiated light to an outside, wherein the first chromaticity rank and the second chromaticity rank are different from each other, and the radiated light is within a chromaticity range of turquoise blue.

5 Claims, 6 Drawing Sheets

(51) Int. Cl.
 *F21K 9/68* (2016.01)
 *F21Y 113/13* (2016.01)
 *F21Y 115/10* (2016.01)

(56) References Cited

U.S. PATENT DOCUMENTS

| | | | | |
|---|---|---|---|---|
| 2013/0194795 A1* | 8/2013 | Onaka | ............... | G02B 19/0066 |
| | | | | 362/326 |
| 2016/0133612 A1* | 5/2016 | Windisch | ........... | H10H 20/8513 |
| | | | | 257/76 |
| 2020/0063927 A1* | 2/2020 | Leung | ....................... | F21K 9/61 |

FOREIGN PATENT DOCUMENTS

| | | |
|---|---|---|
| WO | 2020/080132 A1 | 4/2020 |
| WO | WO-2020209295 A1 * | 10/2020 |

* cited by examiner

LIGHTING DEVICE

This is a National Stage Application of International Application No. PCT/JP2023/015271 filed Apr. 17, 2023, claiming priority based on Japanese Patent Application No. 2022-072787 filed Apr. 26, 2022.

TECHNICAL FIELD

The present invention relates to a lighting device.

BACKGROUND ART

Conventionally, lighting devices that emit light of various colors for the purpose of illuminating objects, displaying information, improving design, etc., are provided on the inside and outside of vehicles. Furthermore, light-emitting diodes of electric power saving and high brightness are also generally used as light sources for these lighting devices. For example, white light is used for headlights, red light is used for taillights and stop lights, and amber light is used for side turn signal lamps.

Furthermore, a lighting device that uses organic electroluminescence to emit light containing a turquoise blue color has been recently proposed (see, for example, Patent Literature 1). In addition to organic electroluminescence, a lighting device in which a light-emitting diode and a wavelength conversion member are combined with each other is known as a lighting device for emitting turquoise blue light as described above.

CITATION LIST

Patent Literature

[Patent Literature 1] International Publication No. WO 2020/080132

SUMMARY OF THE INVENTION

Technical Problem

However, it is known that the emission wavelength of a light-emitting diode changes depending on the temperature and current density. When the wavelength of primary light emitted from the light-emitting diode changes, the amount of wavelength conversion to secondary light in a wavelength conversion member also changes, so that the chromaticity of radiated light radiated from the entire lighting device also changes.

FIG. 6 is a chromaticity diagram showing a chromaticity change in an example of a conventional lighting device that emits turquoise blue light. The horizontal axis in FIG. 6 represents chromaticity Cx, and the vertical axis represents chromaticity Cy. A range surrounded by broken lines in the chromaticity diagram represents the chromaticity range of a turquoise blue color. Triangular marks shown in the chromaticity diagram indicate a change in the chromaticity diagram when the value of current flowing through the lighting device at a temperature of 25° C. changes. The light-emitting diode used has a chip size of 1 mm$^2$.

In the example shown in FIG. 6, when the current value changes from 1.0 A to 0.35 A (the current density changes from 1.0 A/mm$^2$ to 0.35 A/mm$^2$), the chromaticity (Cx, Cy) changes from (0.09, 0.38) to (0.08, 0.44). FIG. 6 shows a case where the current value changes, but it is known that change of chromaticity also occurs when the temperature changes. In particular, in the chromaticity range of the turquoise blue color, there is a tendency that the change of chromaticity for the change in emission wavelength is great. Therefore, in order to emit turquoise blue light using a lighting device, it is necessary to select and use a lighting device having characteristics that are within the range of turquoise blue chromaticity even when current change and temperature change occur in a usage environment.

In general, selection of a narrow characteristic range as described above leads to a decrease in yield and causes an increase in manufacturing cost. Even when a lighting device selected so as to satisfy the characteristic range is used, there will still be a difference in chromaticity between the upper and lower limits of the turquoise blue chromaticity, so that it is preferable to make the chromaticity uniform by using vicinities of the center of the turquoise blue chromaticity as much as possible.

Therefore, the present invention has been made in consideration of the above-mentioned problems in the conventional art, and has an object to provide a lighting device that can relax a selection requirement for a turquoise blue color to improve yield and make chromaticity uniform.

Solution to Problem

In order to solve the above problem, a lighting device according to the present invention comprises a first light-emitting element that emits first light belonging to a first chromaticity rank, a second light-emitting element that emits second light belonging to a second chromaticity rank, and a light mixing unit that mixes the first light and the second light and radiates the light as radiated light to an outside, wherein the first chromaticity rank and the second chromaticity rank are different from each other, and the radiated light is included in a chromaticity range of turquoise blue.

In the lighting device of the present invention as described above, the first light belonging to the first chromaticity rank and the second light belonging to the second chromaticity rank are mixed with each other in the light mixing unit, and even when the first chromaticity rank and the second chromaticity rank are different from each other, the radiated light is included the chromaticity range of turquoise blue, so that it is possible to improve yield by relaxing a selection requirement for turquoise blue and make chromaticity uniform.

In one aspect of the present invention, the first chromaticity rank and the second chromaticity rank include an overlap chromaticity range that is a common chromaticity range.

In one aspect of the present invention, at least one of the first chromaticity rank and the second chromaticity rank also includes an outer chromaticity range that is outside the chromaticity range of turquoise blue.

In one aspect of the present invention, the first light-emitting element and the second light-emitting element have chromaticity changes in opposite directions from each other with temperature change.

In one aspect of the present invention, the first light-emitting element and the second light-emitting element respectively include different wavelength conversion members.

In one aspect of the present invention, the chromaticity range of turquoise blue corresponds to wavelengths of 485 nm or more and 500 nm or less.

Advantageous Effect of Invention

The present invention can provide a lighting device that can improve yield by relaxing the selection requirement for turquoise blue color and make chromaticity uniform.

BRIEF DESCRIPTION OF THE DRAWINGS

FIG. 5(a) shows a case where the wavelength shortens as the temperature increases, and FIG. 5(b) shows a case where the wavelength lengthens as the temperature increases.

MODES FOR CARRYING OUT THE INVENTION

First Embodiment

Figure 1:
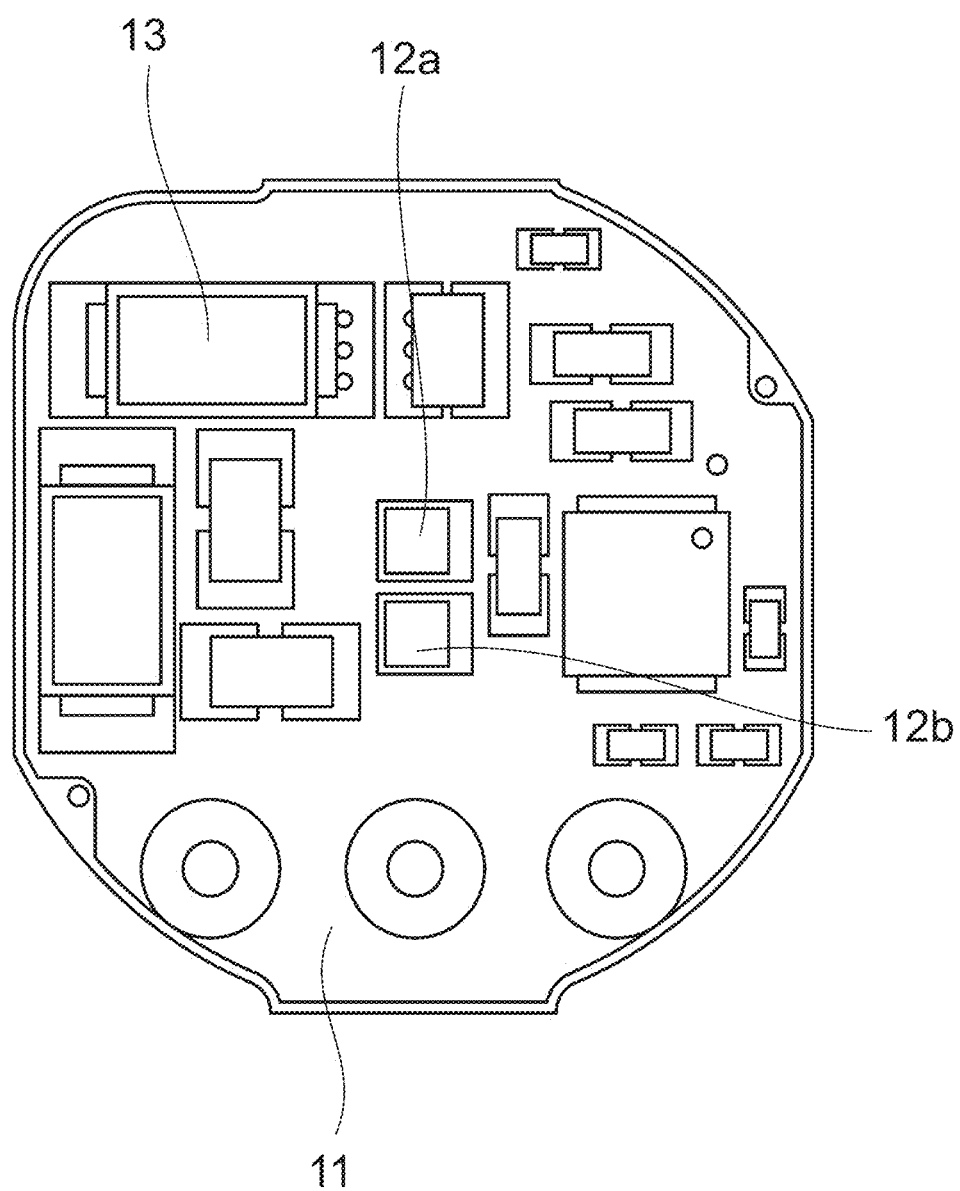
FIG. 1 is a schematic plan view showing an example of the configuration of a light-emitting unit 10 to be used in a lighting device 100 according to a first embodiment.

An embodiment of the present invention will be described below in detail with reference to the drawings. The same or equivalent components, members, and processes shown in respective drawings are given the same reference signs, and duplicated description thereof will be omitted as appropriate. FIG. 1 is a schematic plan view showing an example of the configuration of a light-emitting unit 10 to be used in a lighting device 100 according to the present embodiment. The light-emitting unit 10 is a portion that emits light in the lighting device 100. As shown in FIG. 1, the light-emitting unit 10 includes a mounting portion 11, light-emitting elements 12a, 12b, and an electronic component 13.

The mounting portion 11 is a member on which a wiring pattern (not shown) is formed and the light-emitting elements 12a, 12b and the electronic component 13 are mounted. The configuration of the mounting portion 11 is not limited, and known materials and structures such as a normal printed circuit board, a ceramic board, a resin board, etc. can be used.

The light-emitting elements 12a, 12b are optical components that are mounted on the mounting portion 11 and supplied with electric power to emit light of a predetermined wavelength, and correspond to a first light-emitting element and a second light-emitting element in the present invention. First light and second light emitted by the light-emitting elements 12a, 12b belong to a first chromaticity rank and a second chromaticity rank, respectively. Furthermore, as described later, the first light and the second light emitted by the light-emitting elements 12a, 12b are mixed with each other in a light mixing unit 20 to form radiated light, and the radiated light belongs to a chromaticity range of a turquoise blue chromaticity.

The configurations of the light-emitting elements 12a, 12b are not limited, but an LED package in which a light-emitting diode (LED) for emitting primary light is combined with a wavelength conversion member for converting the wavelength of a part of the primary light into that of the secondary light can be used. Furthermore, the material of the light-emitting diode is also not limited, and known materials and structures can be used. As an example, a GaN-based LED for emitting blue light can be used. Furthermore, the material of the wavelength conversion member is also not limited. In the light-emitting elements 12a, 12b, a part of the primary light emitted by the light-emitting diode is converted into secondary light by the wavelength conversion member, and the first light belonging to the first chromaticity rank and the second light belonging to the second chromaticity rank are radiated by the remaining primary light that has not been converted and the secondary light. Furthermore, the light-emitting elements 12a, 12b may include different wavelength conversion members, so that they have different characteristics of chromaticity change caused by temperature change or current change. The sizes of the light-emitting elements 12a, 12b are not limited, but as an example, a chip size of 1 mm$^2$ can be used.

The electronic component 13 is a component that is mounted on the mounting portion 11, and supplied with electric power to perform a predetermined operation. Known resistor, diode, transistor, coil, or IC (Integrated Circuit) can be used as the type of the electronic component 13. A circuit for driving the light-emitting elements 12a, 12b is configured by the wiring pattern, the light-emitting elements 12a, 12b and the electronic component 13 which are mounted on the mounting portion 11.

Figure 2:
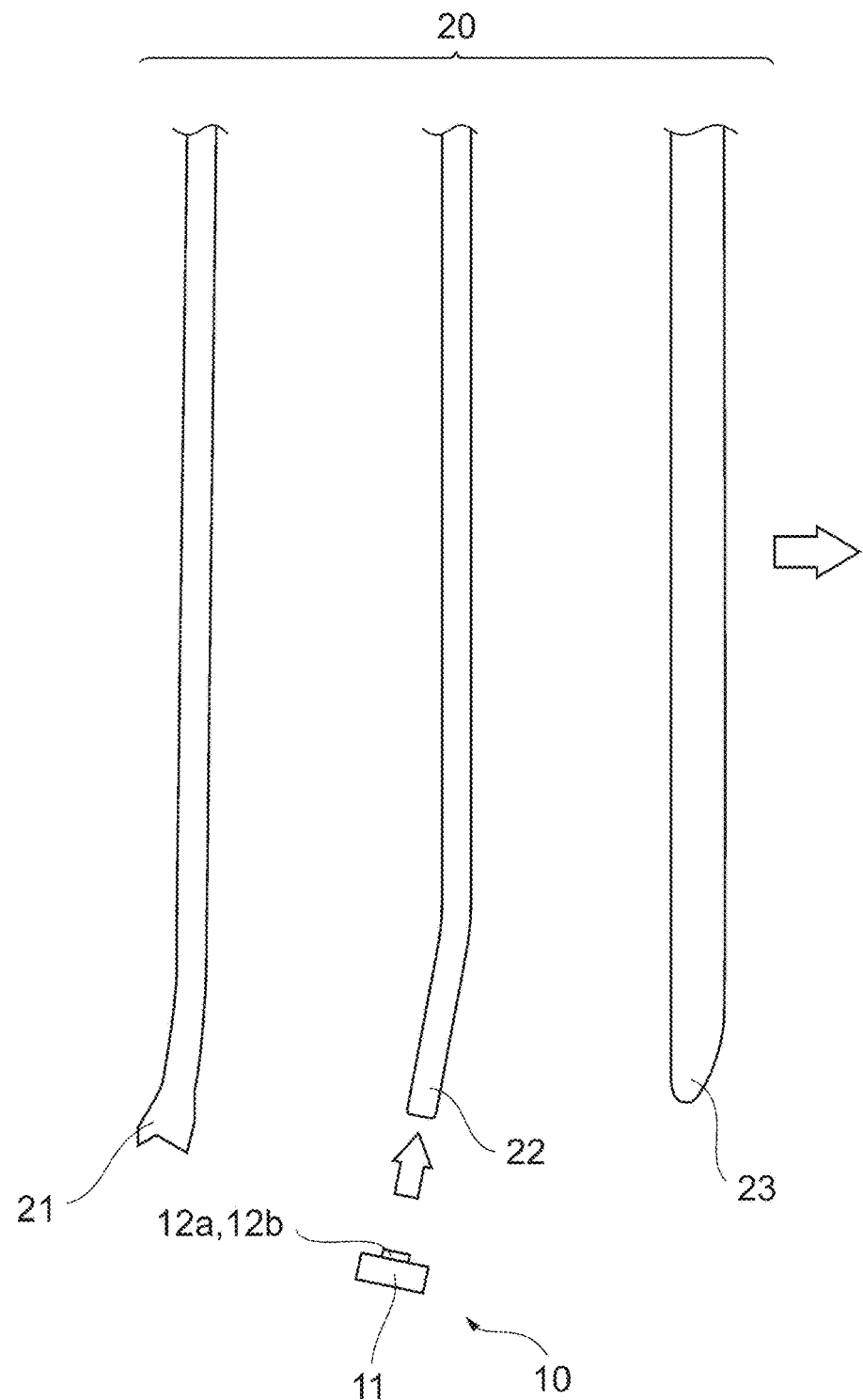
FIG. 2 is an exploded view schematically showing an example of the configuration of the lighting device 100 according to the first embodiment.

FIG. 2 is an exploded view schematically showing a configuration example of the lighting device 100 according to the present embodiment. As shown in FIG. 2, the lighting device 100 is configured by combining a light-emitting unit 10 and a light mixing unit 20. The light mixing unit 20 is a portion that mixes the first light and the second light from the light-emitting elements 12a, 12b included in the light-emitting unit 10 and radiates the light as radiated light to the outside. In the example shown in FIG. 2, the light mixing unit 20 is configured by combining a reflector 21, a light guide member 22, and a light diffusing member 23.

The reflector 21 is an optical member that is disposed behind the light guide member 22, and reflects at least a part of the light radiated from the light guide member 22 by its reflective surface. The light reflected by the reflector 21 is radiated toward the outside of the lighting device 100 via the light guide member 22 and the light diffusing member 23. The material constituting the reflector 21 is not limited, but it is possible to use a material obtained by using a conventionally known resin material or the like and coating the surface thereof with a highly reflective coating. In the example described above, the reflector 21 and the light guide member 22 are configured as separate bodies, but the reflector 21 may be omitted by forming a highly reflective film or the like on the side surface of the light guide member 22.

The light guide member 22 is an optical member that is configured by a material transmitting light therethrough, guides light along an extension direction thereof, and radiates the guided light from the side surface thereof. A light incidence portion is provided at one end of the light guide member 22, and the light-emitting unit 10 is arranged to face the light incidence portion. The light guide member 22 has uneven steps formed along the side surface thereof, and light which has guided in the light guide member 22 is reflected by the uneven steps, and radiated to the outside of the light guide member 22 from the side surface. In the example shown in FIG. 2, a light pipe having a substantially cylindrical shape is shown as the light guide member 22, but it may be plate-shaped, and the specific shape thereof is not limited.

The light diffusing member 23 is a member that is arranged on a light emission surface side of the light guide member 22 and configured by a material transmitting at least a part of light, and diffuses the light. The material constituting the light diffusing member 23 is not limited, and known resin materials or glass materials can be used. Furthermore, the structure for diffusing light in the light diffusing member 23 is not limited, and it is possible to use a structure in which light scattering particles having different refractive indices are contained in a resin material, a structure in which the front or back surface of the light diffusing member 23 is roughened, a structure in which the light diffusing member 23 is a diffusion lens, and the like.

In the lighting device 100 shown in FIG. 1 and FIG. 2, when electric power is supplied to the light-emitting elements 12a, 12b of the light-emitting unit 10, the light-emitting elements 12a, 12b emit first light and second light, respectively. While the first light and the second light emitted by the light-emitting unit 10 is propagating in a longitudinal direction inside the light guide member 22, a part of the light is reflected by the reflector 21 and the other part is reflected by the uneven steps, and the light is incident from the light emission surface side to the light diffusing member 23. The light incident to the light diffusing member 23 is diffused by a light diffusing structure provided in the light diffusing member 23, and radiated as radiated light to the outside. The radiated light at this time is a mixture of the first light and the second light that is caused by the reflection at the light guide member 22 and the reflector 21 and the diffusion at the light diffusing member 23 and belongs to the chromaticity range of turquoise blue chromaticity.

Figure 3:
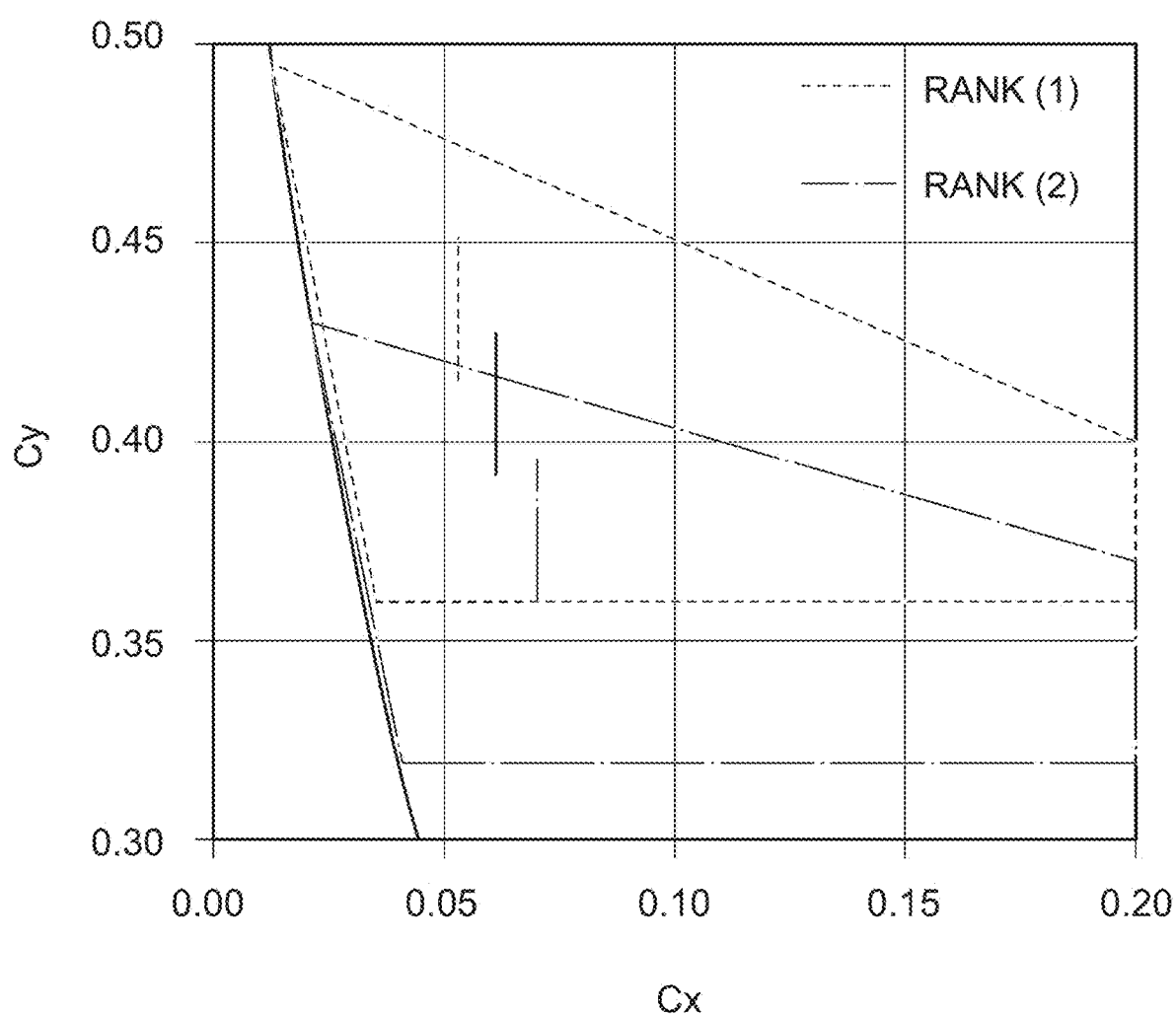
FIG. 3 is a chromaticity diagram showing the relation of first light, second light, and radiated light in the lighting device 100 according to the first embodiment.

FIG. 3 is a chromaticity diagram showing the relation between the first light, the second light, and the radiated light in the lighting device 100 according to the present embodiment. The horizontal axis in FIG. 3 indicates chromaticity Cx, and the vertical axis indicates chromaticity Cy. Here, the chromaticity range (Cx, Cy) of turquoise blue is within a trapezoidal range surrounded by four points (0.012, 0.495), (0.200, 0.400), (0.200, 0.320), and (0.040, 0.320), and the wavelength is 485 nm or more and 500 nm or less.

Furthermore, the trapezoidal range surrounded by broken lines in the chromaticity diagram indicates the chromaticity range of the first chromaticity rank, and the trapezoidal range surrounded by alternate long and short dashed lines indicates the chromaticity range of the second chromaticity rank. The straight lines shown in FIG. 3 indicate the chromaticity change when the current changes or the temperature changes, the broken lines indicate the first light of the light-emitting element 12a, the alternate long and short dashed lines indicate the second light of the light-emitting element 12b, and the solid line indicates the radiated light emitted from the light mixing unit 20.

In the example shown in FIG. 3, the first chromaticity rank (Cx, Cy) is within a trapezoidal range surrounded by four points (0.012, 0.495), (0.200, 0.400), (0.200, 0.360), and (0.040, 0.360). Furthermore, the second chromaticity rank (Cx, Cy) is within a trapezoidal range surrounded by four points (0.012, 0.430), (0.200, 0.370), (0.200, 0.320), and (0.040, 0.320). Therefore, the first chromaticity rank and the second chromaticity rank are common in that a trapezoidal range surrounded by the four points (0.012, 0.430), (0.200, 0.370), (0.200, 0.360), and (0.040, 0.360) is an overlap chromaticity range.

The light-emitting element 12a has a characteristic that the chromaticity changes within a range along the broken straight lines shown in FIG. 3 when the current value (current density) changes, and is classified as belonging to the first chromaticity rank. The light-emitting element 12b has a characteristic that the chromaticity changes within a range along the alternate long and short dashed straight lines shown in FIG. 3 when the current value (current density) changes, and is classified as belonging to the second chromaticity rank. Here, the ranking of the light-emitting elements 12a, 12b when the current changes can be performed by placing the light-emitting elements 12a, 12b inside an integrating sphere whose temperature is kept constant, and measuring the chromaticity using a spectrometer while a pulsed current is supplied with changing the current value. Alternatively, light-emitting elements 12a, 12b may be used which have been subjected to a characteristic inspection and ranked in advance by a manufacturer of the light-emitting elements 12a, 12b at the time of shipment.

Since the radiated light is a mixture of the first light and the second light, it has an intermediate chromaticity when the light quantities of the first light and the second light are the same, so that the chromaticity changes within the range along the solid line shown in FIG. 3. Therefore, the radiated light is also included in the chromaticity range of turquoise blue. Furthermore, since the chromaticity of the radiated light is an intermediate chromaticity between the first light and the second light, the chromaticity of the radiated light is closer to the center of the chromaticity range of turquoise blue than the first light and the second light. FIG. 3 shows the change in chromaticity when the current value changes, but the same effect can be obtained for the change in chromaticity when the temperature changes. The ranking of the light-emitting elements 12a, 12b when the temperature changes can be performed by placing the light-emitting elements 12a, 12b inside an integrating sphere and measuring the chromaticity using a spectrometer when the same current is supplied with changing the temperatures.

As described above, in the lighting device 100 of the present embodiment, the first light belonging to the first chromaticity rank and the second light belonging to the second chromaticity rank are mixed with each other in the light mixing unit 20, so that the radiated light is included in the chromaticity range of turquoise blue even when the first chromaticity rank and the second chromaticity rank are different from each other. As a result, it is possible to relax the selection requirement for the turquoise blue color to improve yields and make chromaticity uniform.

Modification of First Embodiment

FIGS. 4(a), 4(b), 4(c), and 4(d) are a chromaticity diagram showing combination examples of the first chromaticity rank and the second chromaticity rank in the lighting device 100 according to the present modification. The first embodiment shows a case where both of the first chromaticity rank and the second chromaticity rank are included in the chromaticity range of turquoise blue, but in the present modification, at least one of the first chromaticity rank or the second chromaticity rank also includes an external chromaticity range that is outside the chromaticity range of turquoise blue.

Figure 4C:
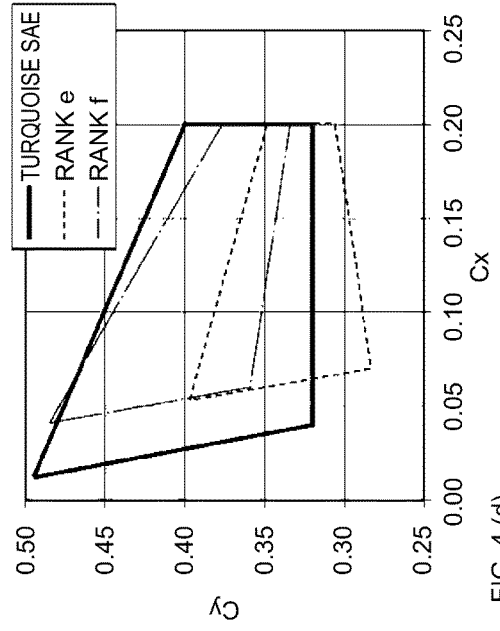
FIGS. 4(a), 4(b), 4(c) and 4(d) are a chromaticity diagram showing a combination example of a first chromaticity rank and a second chromaticity rank in a lighting device 100 according to a modification of the first embodiment.
Figure 4D:
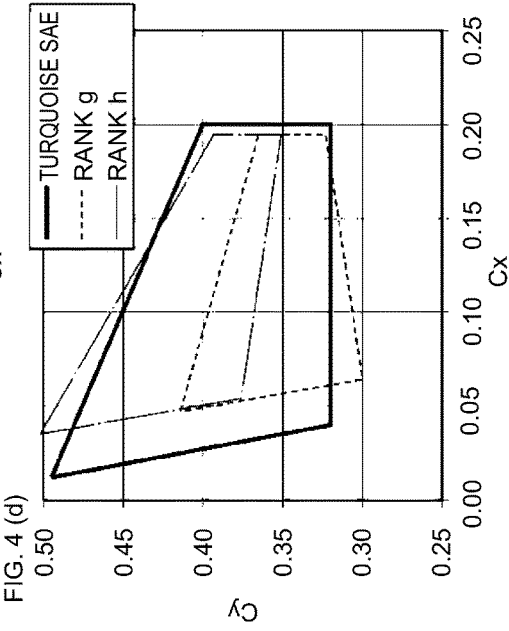
Figure 4A:
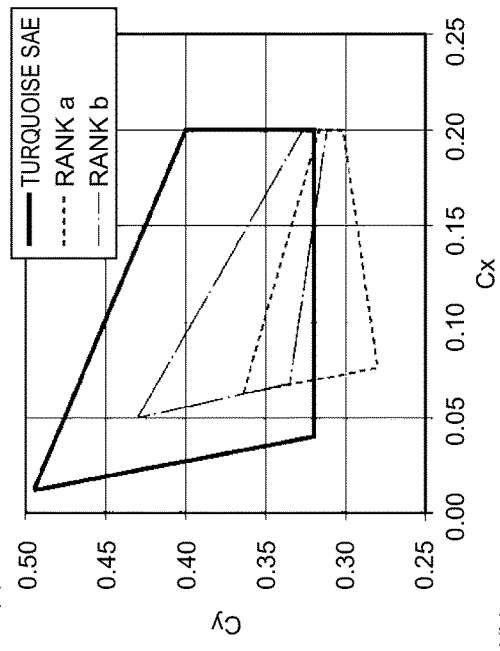

In an example shown in FIG. 4(a), the first chromaticity rank (Cx, Cy) is within a trapezoidal range surrounded by four points (0.063, 0.364), (0.200, 0.317), (0.200, 0.302), and (0.076, 0.280). Furthermore, the second chromaticity rank (Cx, Cy) is within a trapezoidal range surrounded by four points (0.050, 0.430), (0.200, 0.327), (0.200, 0.312), and (0.068, 0.335).

Figure 4B:
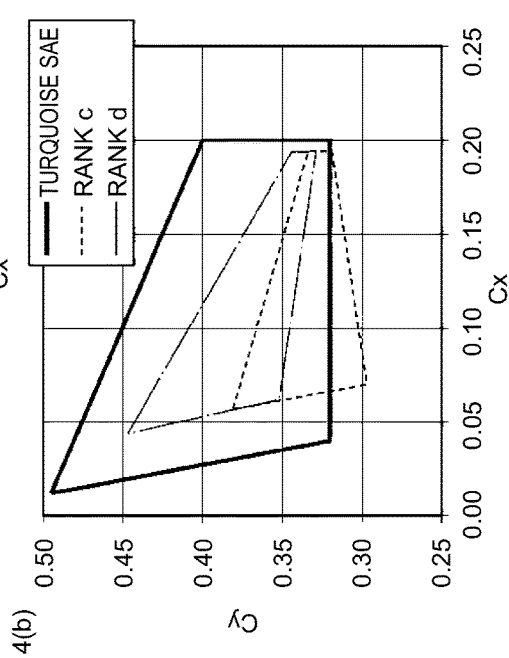

In an example shown in FIG. 4(b), the first chromaticity rank (Cx, Cy) is within a trapezoidal range surrounded by the four points (0.057, 0.381), (0.194, 0.334), (0.194, 0.319), and (0.070, 0.297). The second chromaticity rank (Cx, Cy) is within a trapezoidal range surrounded by four points (0.044, 0.447), (0.194, 0.344), (0.194, 0.329), and (0.062, 0.352).

In an example shown in FIG. 4(c), the first chromaticity rank (Cx, Cy) is within a trapezoidal range surrounded by four points (0.053, 0.397), (0.200, 0.348), (0.200, 0.306), and (0.070, 0.283). The second chromaticity rank (Cx, Cy) is within a trapezoidal range surrounded by four points (0.041, 0.485), (0.200, 0.376), (0.200, 0.334), and (0.060, 0.359).

In an example shown in FIG. 4(d), the first chromaticity rank (Cx, Cy) is within a trapezoidal range surrounded by four points (0.047, 0.414), (0.195, 0.365), (0.195, 0.323), and (0.064, 0.300). The second chromaticity rank (Cx, Cy) is within a trapezoidal range surrounded by four points (0.035, 0.502), (0.195, 0.393), (0.195, 0.351), and (0.054, 0.502).

In the present modification, the first chromaticity rank or the second chromaticity rank is set to include an external chromaticity range outside the chromaticity range of turquoise blue. However, as shown in FIG. 3, the radiated light includes a mixture of the first light and the second light, and has an intermediate chromaticity therebetween, so that the radiated light can be set in the chromaticity range of turquoise blue even when a chromaticity rank including an external chromaticity range is used as one of the chromaticity ranks. As a result, it is possible to relax the selection requirement for the turquoise blue color in light-emitting elements 12a, 12b and improve the yield.

In particular, as shown in FIGS. 4(c), (d), it is preferable that the first chromaticity rank and the second chromaticity rank are provided at upper and lower sides of the turquoise blue chromaticity range, respectively. More specifically, it is preferable that in the chromaticity range of turquoise blue, a part of an intermediate line connecting two points (0.200, 0.360) and (0.008, 0.418) in the middle of Cy is included in the overlap chromaticity range. Furthermore, it is preferable that areas of the first chromaticity rank and the second chromaticity rank which are not included in the overlap chromaticity range are located at upper and lower sides of the intermediate line.

Second Embodiment

Figure 5A:
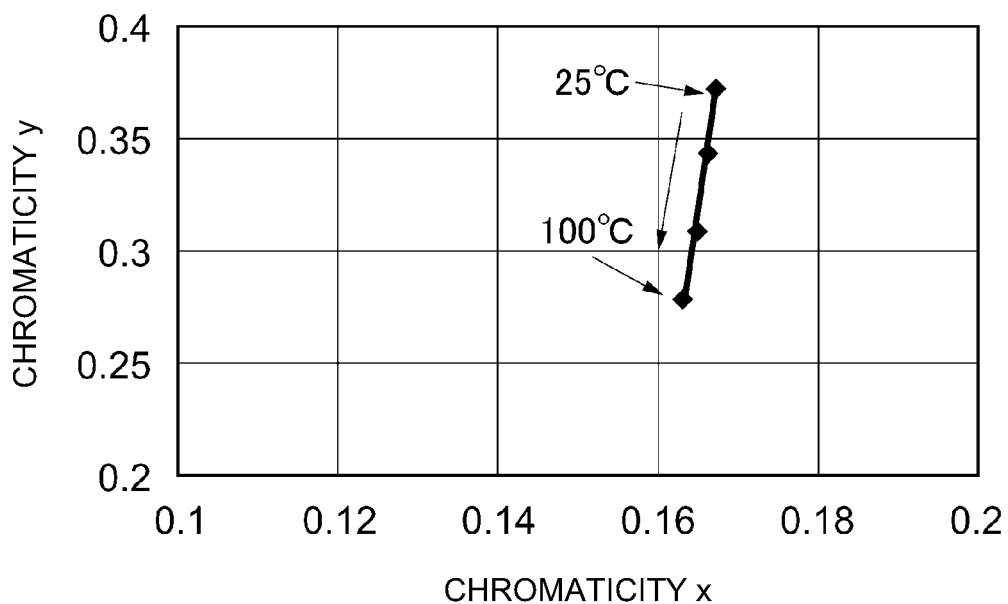
FIGS. 5(a) and 5(b) are a chromaticity diagram showing temperature characteristics of first light and second light in a lighting device 100 according to a second embodiment, where
Figure 5B:
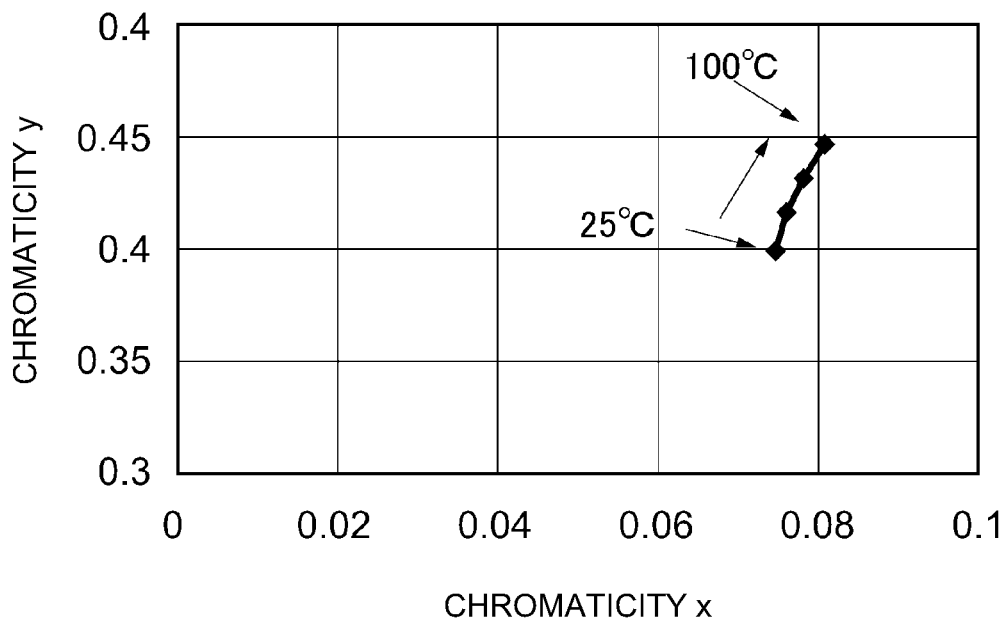
Figure 6:
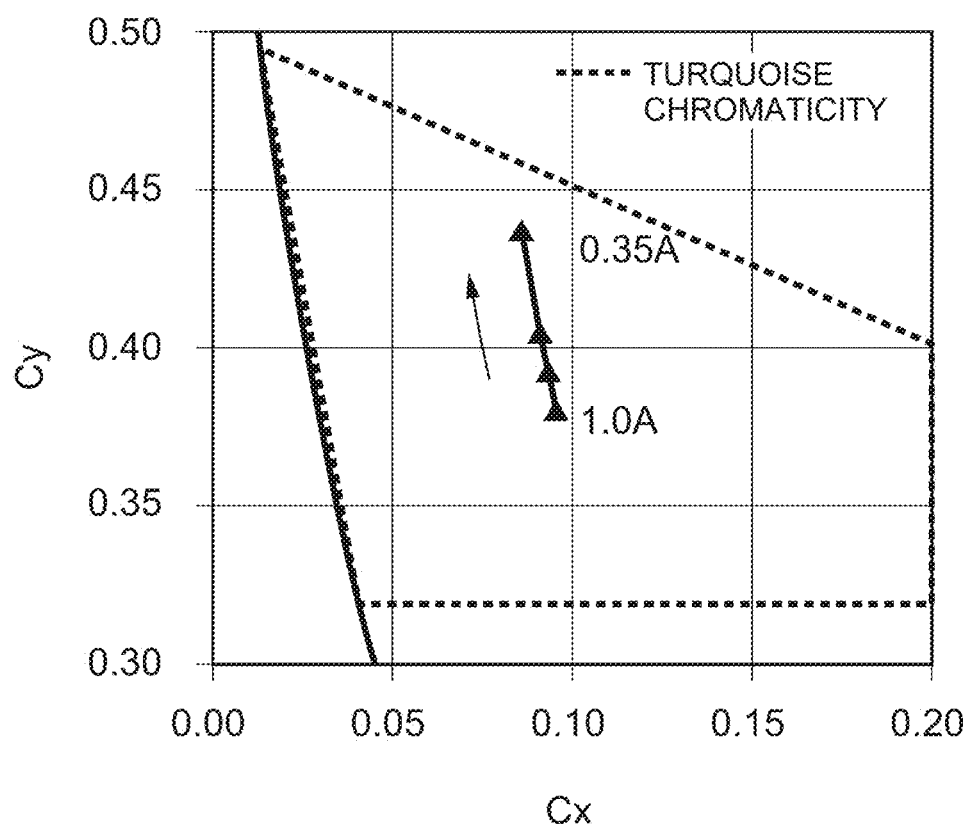
FIG. 6 is a chromaticity diagram showing change of chromaticity in an example of a conventional lighting device that emits light of a turquoise blue color.

Next, a second embodiment of the present invention will be described with reference to FIGS. 5(a) and 5(b). Description on contents which overlap with those of the first embodiment will be omitted. The first embodiment uses the light-emitting elements 12a, 12b which have the same tendency for chromaticity change with respect to temperature change and current change, but the present embodiment uses elements having chromaticity-change characteristics that change in opposite directions to each other. FIGS. 5(a) and 5(b) are a chromaticity diagram showing the temperature characteristics of the first light and the second light in the lighting device 100 according to the present embodiment, where FIG. 5(a) shows a case where the wavelength is shorter as the temperature increases, and FIG. 5(b) shows a case where the wavelength is longer as the temperature increases. The light-emitting elements 12a, 12b used had a chip size of 1 mm$^2$, and measurements were performed with a constant current value (current density).

Materials that increase and decrease the light amount of secondary light respectively when the wavelength of primary light is converted to a long wavelength side by changing the wavelength conversion member are considered to be used for the light-emitting elements 12a, 12b having chromaticity-change characteristics that change in opposite directions from each other as described above. In this case, the chromaticity change of the light radiated from the light-emitting elements 12a, 12b can be made in the opposite directions to each other by shifting the wavelength of the primary light to a longer wavelength side and increasing or decreasing the light amount of the secondary light. Alternatively, the types of light-emitting diodes included in the light-emitting elements 12a, 12b may be made different.

It is assumed that elements having the chromaticity-change characteristics shown in FIGS. 5(a) and 5(b) respectively are used as the light-emitting elements 12a, 12b. When the temperature changes from 25° C. to 100° C., the chromaticity of the light-emitting element 12a changes from (0.168, 0.375) to (0.163, 0.275). Also, the chromaticity of the light-emitting element 12b changes from (0.074, 0.400) to (0.081, 0.448). In other words, in the light-emitting elements 12a, 12b, the chromaticity changes in a direction in which the chromaticity Cy decreases and in a direction in which the chromaticity Cy increases as the temperature increases, and the chromaticity changes in opposite directions to each other as the temperature changes. Also, in the present embodiment, it can be said that the light-emitting elements 12a, 12b belong to different chromaticity ranks.

When the first light and the second light are emitted in equal amounts from light-emitting elements 12a, 12b whose chromaticity changes are opposite to each other with respect to the temperature change, and both of the first light and the second light are mixed with each other in the light mixing unit 20 shown in FIG. 2, the chromaticity of the radiated light changes from (0.121, 0.388) to (0.122, 0.362), which are in the middle of both the chromaticity ranges thereof. The radiated light belongs to the chromaticity range of turquoise blue, and has a smaller chromaticity change than the chromaticity changes of the first light and the second light. FIGS. 5(a) and 5(b) shows the chromaticity change with the temperature change, but the same effect can also be obtained for the chromaticity change with the current change.

In the lighting device 100 of the present embodiment, the first light belonging to the first chromaticity rank and the second light belonging to the second chromaticity rank are mixed with each other in the light mixing unit 20, so that the radiated light is included in the chromaticity range of turquoise blue even when the first chromaticity rank and the second chromaticity rank are different from each other. Furthermore, since the light-emitting element 12a and the light-emitting element 12b have characteristics in which the chromaticity changes thereof are made in opposite directions with respect to temperature change, it is possible to restrain the chromaticity change of the radiated light in which the first light and the second light are mixed. As a result, it is possible to relax the selection requirement for the turquoise blue color, improve the yield, and make chromaticity uniform.

The present invention is not limited to the above-described embodiments, and various modifications are possible within the scope of the claims. Embodiments obtained by appropriately combining the technical means disclosed in the different embodiments are also included in the technical scope of the present invention.

The present international application claims priority based on Japanese Patent Application No. 2022-072787 which is a Japanese Patent Application filed on Apr. 26, 2022, and the entire contents of Japanese patent application No. 2022-072787 are incorporated by reference into the present international application.

The above description of the specific embodiments of the present invention are presented for illustrative purposes. They are not intended to be exhaustive or to limit the invention to the precise forms described. It is obvious to those skilled in the art that numerous modifications and changes are possible in light of the above description.

REFERENCE SIGNS LIST

100 Lighting device
10 Light-emitting unit
20 Light mixing unit
11 Mounting portion
12a, 12b Light-emitting element
13 Electronic component
21 Reflector
22 Light guide member
23 Light diffusing member

The invention claimed is:

1. A lighting device comprising:
a first light-emitting element that emits first light belonging to a first chromaticity rank;
a second light-emitting element that emits second light belonging to a second chromaticity rank; and
a light mixing unit that mixes the first light and the second light and radiates the light as radiated light to an outside, wherein
the first chromaticity rank and the second chromaticity rank are different from each other,
the radiated light is included in a chromaticity range of turquoise blue;
the chromaticity range of turquoise blue corresponds to wavelengths of 485 nm or more and 500 nm or less; and
the first chromaticity rank and the second chromaticity rank overlap within the chromaticity range of turquoise blue.

2. The lighting device according to claim 1, wherein the first chromaticity rank and the second chromaticity rank include an overlap chromaticity range that is a common chromaticity range.

3. The lighting device according to claim 1, wherein at least one of the first chromaticity rank and the second chromaticity rank also includes an outer chromaticity range that is outside the chromaticity range of turquoise blue.

4. The lighting device according to claim 1, wherein the first light-emitting element and the second light-emitting element have chromaticity changes in opposite directions from each other with temperature change.

5. The lighting device according to claim 1, wherein a region where the first chromaticity rank and the second chromaticity rank overlap includes a center of the chromaticity range of turquoise blue with respect to a y coordinate.

* * * * *